(12) United States Patent
Feiler et al.

(10) Patent No.: US 6,674,125 B2
(45) Date of Patent: Jan. 6, 2004

(54) SEMICONDUCTOR POWER COMPONENT AND A CORRESPONDING MANUFACTURING METHOD

(75) Inventors: Wolfgang Feiler, Reutlingen (DE); Robert Plikat, Vaihingen/Enz (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 10/119,515

(22) Filed: Apr. 10, 2002

(65) Prior Publication Data

US 2002/0177285 A1 Nov. 28, 2002

(30) Foreign Application Priority Data

Apr. 10, 2001 (DE) .......................... 101 17 801

(51) Int. Cl.[7] .................. H01L 29/76; H01L 29/94; H01L 31/062
(52) U.S. Cl. ..................... 257/339; 257/565
(58) Field of Search ................. 257/329, 330, 257/332, 339, 341, 409, 487, 497, 565

(56) References Cited

U.S. PATENT DOCUMENTS

| 6,262,470 B1 | * | 7/2001 | Lee et al. ............. 257/565 |
| 6,495,871 B2 | * | 12/2002 | Hattori et al. ........... 257/279 |
| 2001/0052601 A1 | | 12/2001 | Onishi et al. |

FOREIGN PATENT DOCUMENTS

| DE | 196 04 043 | 8/1997 |
| DE | 31 10 230 | 7/1998 |
| DE | 198 16 448 | 9/1999 |
| DE | 198 40 032 | 11/1999 |
| EP | 0 869 558 | 10/1998 |
| WO | 00/14807 | 3/2000 |
| WO | 00/68998 | 11/2000 |

OTHER PUBLICATIONS

T. Laska et al., Conference Proceedings ISPSD 1997, pp. 361–364.
J. Yedinak et al., Conference Proceedings ISPSD 1998, pp. 399–402.
I. Omura et al., Conference Proceedings ISPSD 1997, pp. 217–220.
Laska et al., Solid State Electronics, vol. 35, No. 5, pp. 681–685.

* cited by examiner

Primary Examiner—Kamand Cuneo
Assistant Examiner—Asok Kumar Sarkar
(74) Attorney, Agent, or Firm—Kenyon & Kenyon

(57) ABSTRACT

A semiconductor power component is described having a rear-side anode contact, a rear-side emitter region of a first conductivity type, which is connected to the rear-side anode contact, a drift region, which is connected to the rear-side emitter region and partially extends to the front-side surface, a front-side MOS control structure, and a front-side cathode contact, which is connected to the source region and the body region. The drift region includes a first drift region of the second conductivity type, a second drift region of the second conductivity type, and a third drift region of the first conductivity type. The first drift region is a buried region. The second drift region connects the front-side surface to the first drift region. The third drift region borders on a body region and connects the front side surface to the first drift region. The degree of compensation to be determined from the second and third drift region is greater than one and has a maximum in the area of the side of the third drift region that is facing away from the front-side surface. The present invention also creates a corresponding manufacturing method.

7 Claims, 8 Drawing Sheets

SEMICONDUCTOR POWER COMPONENT AND A CORRESPONDING MANUFACTURING METHOD

FIELD OF THE INVENTION

The present invention relates to a semiconductor power component and a corresponding method of manufacture.

Although it is applicable to other similar semiconductor power components, the present invention as well as the problem underlying it are discussed with reference to a vertical IGBT (Insulated Gate Bipolar Transistor).

BACKGROUND INFORMATION

In general, IGBTs may be used as power switches in the range of some hundreds to some thousands of volts of blocking voltage. In particular, the use of IGBTs of this type as ignition transistors, i.e., as switches on the primary side of an ignition coil, may be of particular interest.

The structure of a vertical IGBT may be similar to that of a VDMOS transistor, although with the difference that, in the VDMOS transistor, on its anode side a $p^+$-emitter may be arranged in place of an $n^+$-substrate. German Published Patent Application No. 31 10 230 describes a vertical MOSFET component having the basic structure of a vertical IGBT.

In principle, two types of vertical IGBT, or V-IGBT may be distinguished in this context, namely the so-called punch-through IGBT (PT) and the so-called non-punch-through IGBT, as described, for example, in Laska et al., Solid State Electronics, Vol. 35, No. 5, pp. 681–685.

On the basis of FIGS. 7 and 8, the fundamental characteristics of these two IGBT types are described below.

FIG. 7 shows a schematic cross-sectional representation of an NPT-IGBT, whose active region, designated by reference numeral 200, has cell-shaped or strip-shaped MOS miniature-circuit-breaker assemblies 203, 206, 207, 208, 209. In this context, reference numeral 208 specifically designates a p-body zone, 206 an $n^+$-source region, 207 a $p^+$-contact region for joining p-body zone 208 to a cathode terminal 201, which at the same time is connected to $n^+$-source region 206, 203 a gate terminal, 209 a gate oxide, and 210 an intermediate oxide. Furthermore, 204 designates an $n^-$-drift region, 205 a reverse-side $p^+$-emitter, and 202 an anode terminal.

The NPT-IGBT in accordance with FIG. 7 may be manufactured on a low-doped $n^-$-substrate having a high charge carrier service life. After introducing the diffusion profile on front side VS of the wafer for producing MOS miniature-circuit-breaker assemblies 203, 206, 207, 208, 209, on rear side RS of the wafer, $p^+$-emitter 205 is produced in very planar form having only a few $\mu$m of penetration depth (d≈a few $\mu$m) and having poor emitter efficiency. This transparent emitter region 205 functions to rapidly switch off the current in the dynamic operation of this component in order to assure that the shut-off losses are kept small. To achieve satisfactory forward properties despite such a poor emitter region 205, the carrier service life may need to be selected so as to be as high as possible in $n^-$-drift region 204. In addition, the thickness of $n^-$-drift region 204 may be selected so as to be as small as possible, taking into account the desired blocking capacity of the component. As a consequence thereof, it may be required that very thin wafers be processed, in the range of blocking capacities of 1 kV and less. This may be very expensive and may have only become possible in recent years. As an example of this, see T. Laska et al., Conf. Proc. ISPSD'97, pp. 361–364.

FIG. 8 shows a schematic cross-sectional representation of a PT-IGBT, whose active region, represented by reference numeral 100, has cell-shaped or strip-shaped MOS miniature-circuit-breaker assemblies 103, 106, 107, 108, 109. Specifically, in this context, reference numeral 108 designates a p-body zone, 106 an $n^+$-source region, 107 a $p^+$-contact region for connecting p-body zone 108 to a cathode terminal 101, which at the same time is connected to $n^+$-source region 106, 103 a gate terminal, 109 a gate oxide, and 110 an intermediate oxide. Furthermore, 104 designates an $n^-$-drift region and 150 an $n^-$-buffer region, 105 a rear-side $p^+$-emitter, and 102 an anode terminal.

The PT-IGBT according to FIG. 8 may be produced on a thick, $p^+$-doped substrate, which simultaneously forms rear-side emitter region 105, having an epitactically-applied n-buffer region 150 and epitactically applied $n^-$-drift region 104. Because, in order to achieve the smallest possible forward voltage drop, the thickness of $n^-$-drift region 104 is selected so as to be smaller than is required by the width of the space-charge zone in the drift region at the desired blocking capacity, n-buffer region 150 may act to prevent a penetration of the space-charge zone to $p^+$-emitter 105. In order to achieve a rapid switching off of the current despite good emitter 105, the charge-carrier service life may be kept short by a so-called lifetime killing, e.g., using electron irradiation, and/or the doping in n-buffer region 150 may be selected so as to be correspondingly heavy. Since the forward voltage may increase as the buffer dosage rises, it may be possible, using a heavily doped, thin buffer region 150, to achieve a good compromise between the forward voltage and the switch-off performance. A buffer of this kind may only be achieved to a limited degree using this type of double EPI/substrate wafer, due to the buffer diffusion in the manufacture of the raw wafer.

In what follows, a brief discussion of the mode of functioning of the aforementioned IGBT types is provided.

For the forward case, in both IGBT types, gate terminal 103, and 203, opposite cathode terminal 101, and 201, is set at a potential above the threshold voltage of MOS miniature-circuit-breaker assemblies 103, 106, 107, 108, 109, and 203, 206, 207, 208, 209. Subsequently, in the area of p-body region 108, and 208, an inversion channel may be produced on the semiconductor surface beneath gate terminal 103, and 203. The semiconductor surface in the area of $n^-$-drift region 104, and 204, may then be in a condition of accumulation. In response to a positive voltage at anode terminal 102, and 202, opposite the cathode, electrons are injected into $n^-$-drift region 104, and 204, through $n^+$-source regions 106, and 206, the influenced MOS channels in body regions 108, and 208, and the accumulation layer.

Subsequently, anode-side emitter region 105, and 205, injects holes, as a result of which $n^-$-drift region 104, and 204, is flooded by charge carriers such that its conductivity may be increased. In customary forward-current densities, the $n^-$-drift region may be in a state of high injection. As a result, an IGBT having a blocking capacity beginning at roughly 150–200 volts may be capable of conveying higher current densities having a smaller voltage drop between anode and cathode than a MOS transistor having the same breakdown voltage. In the forward case, the current flows from the anode to the cathode. It is carried by electrons that are injected into $n^-$-drift region 104, and 204, and that flow to the anode via anode-side emitter 105, and 205, and by holes which are injected by the anode-side emitter into n⁻-drift region 104, and 204, and which flow to the cathode via p-regions 107, 108, and 207, 208.

In the blocking case, gate terminal 103, and 203, opposite cathode terminal 101, and 201, is brought to a voltage below the threshold voltage. If anode terminal 102, and 202, is now brought to a positive potential, then the space-charge zone situated between p-body region 108, and 208, and n⁻-drift region 104, and 204, may expand virtually exclusively into n⁻-drift region 104, and 204.

In the case of NPT-IGBT, the thickness of n⁻-drift zone 204 may be selected so as to be greater than the width of the space-charge zone at a given maximum blocking capacity of the component. This may result in the triangular curve, indicated in FIG. 7, of electrical field intensity |E| along the y coordinate. The maximum field intensity may be located in region of the MOS miniature-circuit-breaker assemblies.

In the case of the PT-IGBT, the thickness of n⁻-drift zone 104 may be selected so as to be greater than the width of the space-charge zone would be at a given maximum blocking capacity of the component. To prevent the space-charge zone from running up against p⁺-emitter region 105, n-doped buffer zone 150 may be introduced so as to prevent the aforementioned punch-through. This may result in the trapezoidal curve, indicated in FIG. 8, of electrical field intensity |E| along the y coordinate. The maximum field intensity, here too, may be situated in the area of the MOS miniature-circuit-breaker assemblies.

FIG. 9 shows a conventional circuit topology, in which a vertical IGBT is used as ignition transistor 700 in the primary circuit of an ignition coil for an internal combustion engine. For this application as an ignition transistor, a V-IGBT may be used having a required blocking capacity of roughly 400–600 volts.

According to FIG. 9, the V-IGBT, having main terminals 701, 702 and gate terminal 703, is connected to battery voltage 711 via an ignition coil 712. On the secondary side of ignition coil 712, a spark plug 713 is provided. A diode 704, which is connected to gate terminal 708 via a resistor 707, may function as the ESD protection, and resistors 707, 714 (for example, having R707=1 kΩ and R714=10–25 KΩ), on the one hand, may establish the input resistance of the system and, on the other hand, may constitute the load of a clamp diode chain 705, 706. Components 704, 705, 706, 707, 714 may be integrated in a monolithic manner, diode 704, 705, 706 may be made of polysilicon.

The circuit arrangement in accordance with FIG. 9 may be directly operated by a suitable control unit via gate terminal 708. For this purpose, a positive voltage of, for example, 5 volts may be applied at gate terminal 708, whereupon a current rise may be injected through ignition coil 712. At a preestablished time point, the voltage at gate terminal 708 may be reduced step-by-step to roughly 0 volts, whereupon the voltage at node 709 may sharply increase. This voltage rise may be transformed upward to the secondary side of ignition coil 712 and may result in an ignition spark at spark plug 713.

Clamp diode chain 705, 706 may limit the voltage rise at anode terminal 702 to the so-called clamp voltage of roughly 400 volts, in order to protect, the IGBT and the further circuit components. This may be important in the so-called pulse case, which may arise when no ignition spark is generated, for example, as a result of a disconnected ignition cable. Then IGBT 700 may need to absorb the energy that may otherwise be converted in the spark. Without a voltage limitation of this type, the anode voltage at node 709, in this context, may increase to the point of the breakdown of IGBT 700 and may destroy the latter. This may be prevented by clamp diode chain 705, 706, as a result of the feature that, when a preselected clamp voltage is achieved, the chain may drive the gate of IGBT 700 just strongly enough so that the clamp voltage at node 709 is not exceeded. Nevertheless, as a result of the large amount of converted energy, this operational case may place high demands on the pulse resistance of the IGBT 700, which may not always be assured to the degree required. A negative consequence may be the destruction of IGBT 700.

J. Yedinak et al, Conf. Proc. ISPSD'1998, pp. 399–402 discusses that a failure may come about in the following manner.

In the pulse case, the space-charge zone may have engaged entire n⁻-drift region 104. As a result of a driving of the gate that is controlled using aforementioned clamp diode 705, 706, electrons, which drive p⁺-emitter 105, are injected into n⁻-drift region 104 through MOS channel configured in p-body region 108. As a result of the high current density, the high field intensity, and therefore the high power loss that may arise, the component may become very hot especially at the MOS miniature-circuit-breaker assemblies, whereupon an electrode leakage current may result. The electrons run in the direction of the anode, and there they may drive p⁺-emitter region 105 high. Thus they may bring about an additional driving of the IGBT. To maintain the voltage at the value of the clamp voltage, the driving of gate 103 may be reduced accordingly via the clamp diode chain. Under certain operating conditions, the driving as a result of the thermally caused electron leakage current may be so strong that the IGBT may conduct the load current without the gate being disconnected. Its controllability may be lost. The temperature may increase further, and the leakage current also may increase further. Finally, a thermal positive feedback may result, and the IGBT may be destroyed.

In addition to planar V-IGBT structures, discussed here, there may also be V-IGVTs having a so-called trench gate, in which the gate is introduced into the semiconductor surface in the form of a trench (I. Omura et al., Conference Proceedings ISPSD'97, pp 217–220). The mode of functioning of these trench-gate V-IGBTs may be entirely analogous to the structures discussed here; however, they may offer the advantage of a smaller forward voltage drop.

In German Published Patent Application No. 198 16 448, a universal semiconductor disk is described for high-voltage components and, inter alia, also for V-IGBTs, in which on an, e.g., n⁻-doped semiconductor substrate, at least one n-doped epitactical layer may be provided, which may be characterized by the feature that in the boundary surfaces between the substrate and the at least one epitactical layer a multiplicity of floating, p-doped semiconductor regions may be embedded, which may be dimensioned so that the dimension size of a floating region is small in comparison to the layer thickness of the at least one epitactical layer, and it essentially corresponds to the distance between the floating regions in a boundary surface, the distance being smaller than the dimension size. In this context, the floating regions lying in one plane may be connected to each other so that they constitute a grid. In the example of the V-IGBT, the assumption may be made that, in the active region of the V-IGBT, when a blocking voltage is applied, the charge carriers are not completely removed from the floating p-regions.

In German Published Patent Application No. 198 40 032, a MOS transistor (e.g., n-channel V-DMOS) having a nonfloating compensation structure in the n-drift region is described. The latter may be characterized by the feature that the compensation structure and/or the n-drift region may be doped such that the degree of compensation changes toward the depths of the component in a monotonic fashion (continuously or step-by-step) as follows: in traversing the compensation structure from source to drain, on the source side, the p-doping dose may predominate over the n-doping dose, whereas on the drain-side end of the compensation structure, the n-doping dose may predominate over the p-doping dose. In response to a blocking voltage, a hump-shaped field distribution may be generated, which has its maximum roughly in the center of the vertical extension of the compensation structure, where n- and p-doping doses compensate for each other. Between the drain-side end of the compensation structure and the $n^+$-substrate, a low-doped n-layer may be optionally arranged. The goal, in any case, may be increased processing reliability and increased robustness in breakdown.

German Published Patent Application No. 196 04 043, discusses favorably influencing the field distribution in a MOS transistor or V-IGBT, using the n-doped and p-doped regions that are permitted into the drift region, in order to reduce the forward voltage drop at a given blocking capacity. In this context, the total quantity of the doping of the introduced n-regions may be roughly the same as the total quantity of the doping of the introduced p-regions. In this context, the introduced regions may be distributed statistically or may be structured in spherical, strip, or filament shapes and may be introduced in pairs. Their separation may be greater than or equal to zero, but smaller than the space-charge zone. The p-regions may be executed so as to be floating. In the event of statistically distributed p- and n-regions, the average concentration of the distributed p-regions may be as great as or greater than the introduced n-regions. For manufacture, inter alia, a method is described which, beginning with a raw wafer, generates the p- and n-doped regions in the n-drift region using a multiple sequence of epitaxy, implantation, and diffusion.

A general problem underlying the present invention therefore may be seen in presenting a robust IGBT especially for ignition applications, which may have good conductive properties and a high pulse resistance, and which may be processed simply.

SUMMARY OF THE INVENTION

A semiconductor power component according to the present invention may provide a more robust IGBT having great pulse resistance without the requirement of processing thin wafers.

The semiconductor power component according to the present invention, in contrast to the structures proposed in German Published Patent Application No. 196 04 043, may be simpler to manufacture and, in contrast to the structures proposed in German Published Patent Application No. 198 40 032, may have increased pulse resistance. In particular, the semiconductor power components according to the present invention may permit small half-cell widths in a simple manner.

An idea underlying the present invention is that p-doped drift regions that are introduced into the n-drift region may be provided in strip and column shape, which may be connected to the cathode metal, e.g., via a p-body region having $p^+$-contact diffusion, so that their potential may not float.

In contrast to conventional structures described in German Published Patent Application No. 196 04 043, in which two different (n- and p-) doped zone types are introduced, the structures according to the present invention may be manufactured more simply because only one additional type of drift region is introduced into the n-drift region.

Furthermore, the structures proposed here may be distinguished from those in German Published Patent Application No. 196 04 043 in that the total net dose of the p-regions introduced in the active region of the V-IGBT, e.g., per half-cell, is greater than the net dose of the part of the n-drift region that may be arranged in the active region between the p-drift regions.

The structures according to the present invention may be distinguished from those in German Published Patent Application No. 198 40 032, in that the degree of compensation $K(y)$ may not decrease in a monotonic fashion from the first semiconductor surface y=0, having a y that grows toward the depths of the component. Rather, the degree of compensation may be set such that it has a maximum in the region of the end of the p-drift regions away from the first semiconductor surface.

According to one example refinement, between the first drift region and the rear-side emitter region, a buffer region of the second conductivity type may be provided.

According to a further example refinement, a contact region of the first conductivity type may partially surround the source region.

According to a further example refinement, the control contact may be a trench gate.

According to a further example refinement, the body region and the source region, on the one hand, and the third drift region, on the other hand, may run in a strip-shaped fashion and not parallel to each other. In contrast to the structures for vertical components described in German Published Patent Application No. 198 40 032, the MOS miniature-circuit-breaker assemblies to be laid out in strip-shaped fashion may be arranged so as to be not parallel to strip-shaped p-drift regions. Rather, the two may be mounted at roughly right angles to each other. This may bring with it advantages in the manufacturing process, as will be further discussed below.

According to a further example refinement, the third drift region may surround a trench filled with an insulating material.

According to a further example refinement, the first conductivity type maybe the p-type, and the second conductivity type may be the n-type.

DETAILED DESCRIPTION

Figure 2:
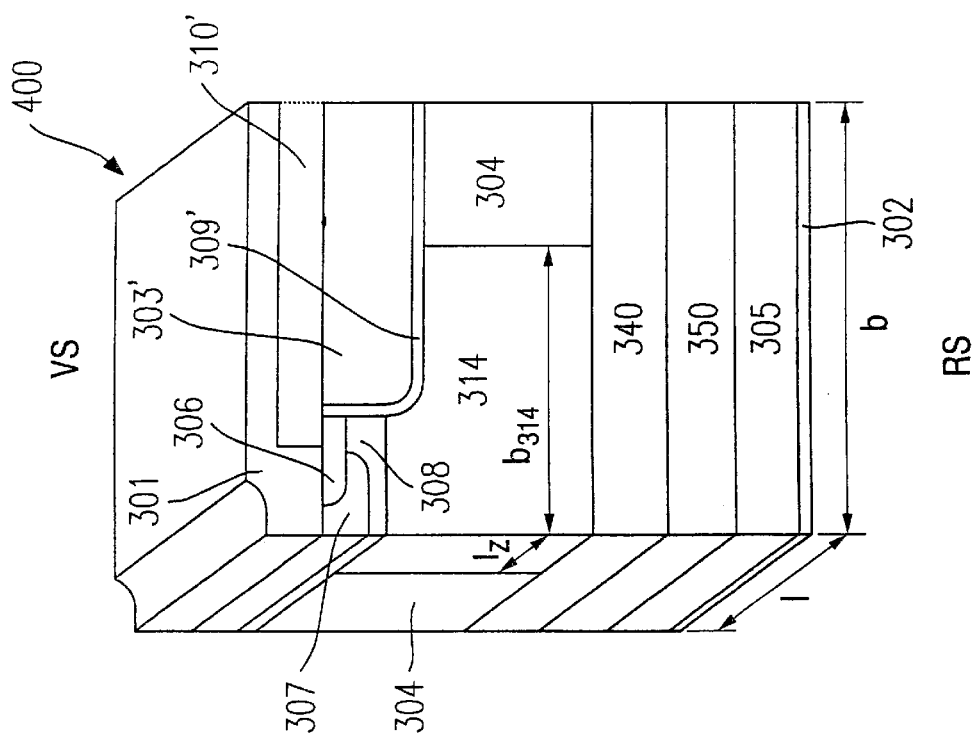
FIG. 2 shows a schematic cross-sectional representation of a semiconductor power component according to a second example embodiment of the present invention.

In the Figures, the same reference numerals designate the same or functionally equivalent components.

Figure 1:
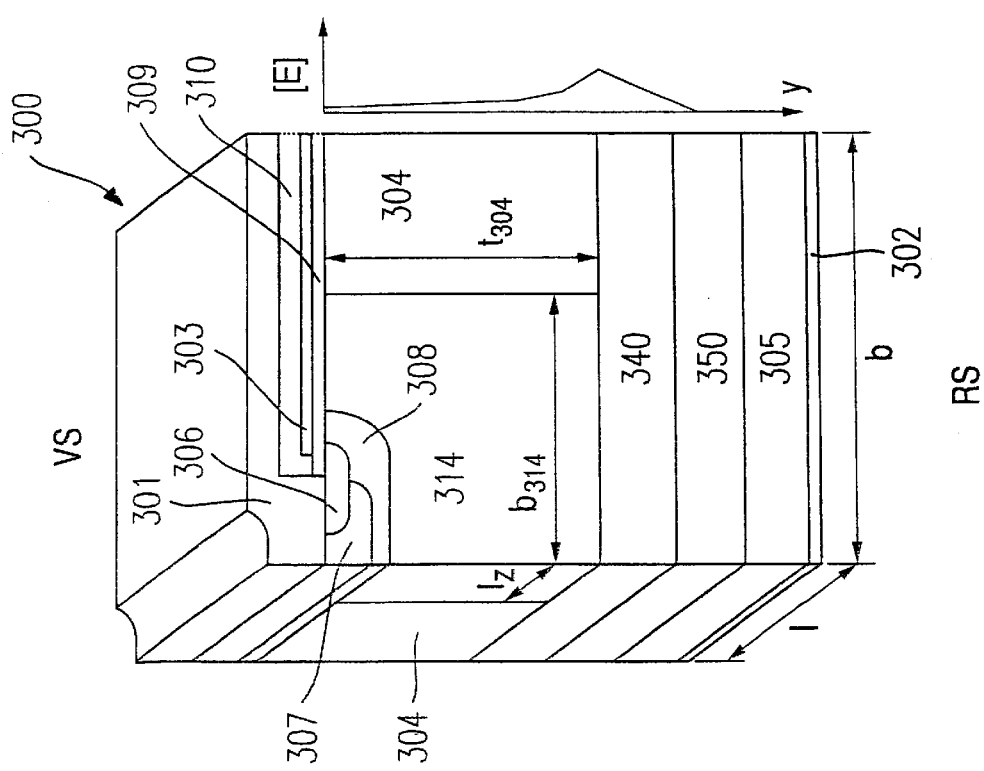
FIG. 1 shows a schematic cross-sectional representation of a semiconductor power component according to a first example embodiment of the present invention

FIG. 1 shows a schematic cross-sectional representation of a semiconductor power component according to a first example embodiment of the present invention.

For the following description, it may be advantageous to introduce the degree of compensation K(y) as follows:

$$K(y)=Sp(y)|Sn(y)-1$$

In this context, y is the coordinate pointing from the first semiconductor surface in the direction of the chip rear side, and $$Sn(y)=\int\int ND(x,y,z)dxdz$$

$$Sp(y)=\int\int NA(x,y,z)dxdz$$

The integration should be extended here in each case in the Cartesian coordinates x and z, orthogonal with respect to y, over the entire active region of the component, which is composed of a multiplicity of cells connected in parallel (cross-section of a half cell, see FIG. 1–FIG. 4). ND(x,y,z) and NA (x,y,z) are the donor and acceptor concentrations in one point P(x,y,z) within the component.

FIG. 1 shows a cutaway section 300 of width b and length l from the active region of a V-IGBT. It may be essential that a degree of compensation K(y)>1 is set in the area of n/p-drift regions 304, and 314, arranged next to each other, which has a maximum in the region of the end of p-drift region 314 away from the front-side semiconductor surface. The entire active region is obtained by a multiple mirroring of the sketched structure on its boundary surfaces.

In FIG. 1, 301 is the cathode metallization, 302 the anode metallization, 303 the gate, which may be made of polysilicon, 314 the p-drift region of width $b_{314}$ and length $l_z$, 304 a first part of the n-drift region of depth $t_{304}$ having a selectively non-constant doping, 340 a second part of the n-drift region having a doping concentration that is selectively different with respect to 304, 350 an optional n-region having a doping concentration that is increased in comparison to 340, which may function, for example, as a buffer, 305 a $p^+$-region functioning as an emitter, 306 an $n^+$-doped source region, 307 a $p^+$-contact diffusion that partially extends beneath 306 and additionally functions to lower the latch-up sensitivity of the V-IGBT, 308 a p-body region, on whose surface, covered by gate oxide 309, an inversion channel may be formed, and 310 the intermediate oxide, that functions as insulation between 301 and 303.

The passivation layers made of nitride or polyimide, that may be conventional and that may be arranged on cathode metallization 301 are not sketched in here for reasons of clarity. For the dimensions of p-drift region 314, $l_z$ may be smaller than or equal to 1, and $b_{314}$ is smaller than or equal to b, $l_z$ and $b_{314}$ being selected so that a uniform vertical path of n-drift region 304 remains from the front-side semiconductor surface to region 340, over which a current flow of electrons may be possible.

Width $b_{314}$ and/or length $l_z$ and/or the dopings of 304, 314 may be executed so as not to be identical in each half-cell, so that, e.g., not every half-cell is furnished with a p-drift region 314. However, for homogeneous functionality of the individual half-cells with respect to each other, this need not be the goal. For the following discussion of the functioning, therefore, the simplifying assumption is made that all half-cells in the active region are executed in an identical manner.

In the forward case, the functioning may be analogous to a conventional V-IGBT. Gate 303, insulated from the semiconductor by a thin gate oxide layer 309, is brought to a potential, with respect to cathode terminal 301, that is above threshold voltage of the MOS miniature-circuit-breaker assemblies. Thereupon, in the region of p-body regions 308 and, if $b_{314}$ is correspondingly wide, of p drift region 314, an inversion channel is generated on the HL surface beneath gate oxide 309. The semiconductor surface in the region of n-drift region 304 is then in a state of accumulation.

In response to a positive anode voltage at anode terminal 302, opposite cathode terminal 301, electrons are injected into n-drift region 304 via $n^+$-region 306, the influenced MOS channels, and the accumulation layer. Thereupon, anode-side $p^+$-emitter 305 injects holes, as a result of which $n^-$-drift region 340 and, in accordance with the degree of the doping, also p/n-drift regions 314, and 304, are flooded by charge carriers such that the conductivity may be increased via the mechanism of high injection. Therefore, good conductivity characteristics may be achieved.

In the blocking case, the mode of functioning proceeds in the following way. Gate 303, opposite cathode terminal 301, is brought to a voltage below the threshold voltage. If anode terminal 302 is now brought to a positive potential, the space-charge zone configured on the boundary between p-drift region 314 and n-drift regions 304, 340, due to K(y)>1, extends more strongly into n-drift regions 304, 340 than into p-drift region 314. P-drift region 314 is only completely cleared of charge carriers for large blocking voltages on the order of magnitude of the breakdown voltage.

In the event of an NPT (non-punch-through) structure, region 350 is eliminated, and the thickness of $n^-$-drift zone 340 is selected so as to be greater than the width of the space-charge zone at a preestablished maximum blocking capacity of the component in $n^-$-drift zone 340.

This may result in the curve, indicated in FIG. 1, of electrical field strength |E| along the y coordinate. It may be essential that the maximum of the field strength is situated not in the area of the MOS miniature-circuit-breaker assemblies, but rather at a depth $t_{304}$ at the base of p-drift region 314. This may be achieved in principle by the selected degree of compensation K(y)>1. In addition, high field strengths in the area of the MOS miniature-circuit-breaker assemblies may be effectively prevented since the degree of compensation K(y) may have its maximum in the area of the end of p-drift region 314 away from the front-side semiconductor surface.

In a PT (punch-through) structure, n-region 350 is present, and either it may be used to optimize the emitter efficiency and the switching performance, and/or the thickness of $n^-$-drift zone 340 is selected so as to be smaller than the width that the space-charge zone would have in a given maximum blocking capacity of the component in $n^-$-drift zone 340. Then n-zone 350 may be used to prevent the space-charge zone from running up against p$^+$-emitter 305.

This may result in a curve, similar to that in FIG. 1, of electrical field strength |E| along the y coordinate, the field however not penetrating far into n-region 350. It may be essential that also in this case the maximum of the field strength is located far from the MOS miniature-circuit-breaker assemblies area roughly at a depth $t_{304}$ at the base of p-drift region 314.

Figure 9:
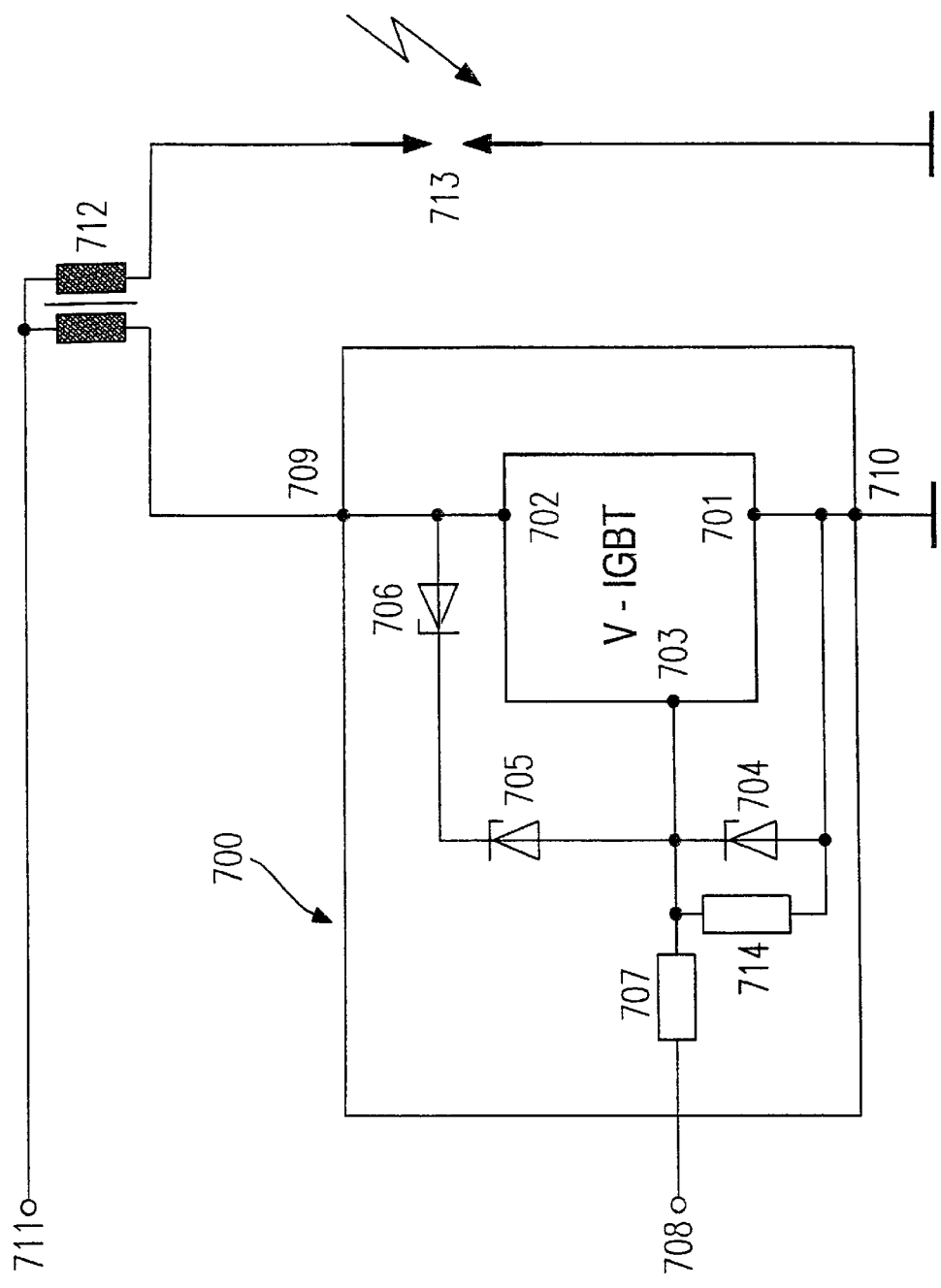
FIG. 9 shows a conventional circuit topology, in which a vertical IGBT is used as an ignition transistor in the primary circuit of an ignition coil for an internal combustion engine.

To represent the pulse case, the V-IGBT is operated in a circuit in accordance with FIG. 9, and it is also assumed that no ignition spark may be generated. The mode of functioning may be analogous to a conventional V-IGBT. As a result of the specific structure of the V-IGBT according to the present invention, the field maximum and the location of the highest heat generation in it may be nevertheless arranged in the depths of the semiconductor. Therefore, it may require a certain amount of time until the MOS miniature-circuit-breaker assembly area is affected by the heat front after the commencement of the pulse case, and only significantly later may it result in the aforementioned effect of thermal positive feedback, which initiates the destruction of the component. As a result of this additional time, which the V-IGBT according to this example embodiment survives in the pulse case, it may attain a significantly higher pulse resistance in comparison to a conventional V-IGBT.

FIG. 2 shows a schematic cross-sectional representation of a semiconductor power component according to a second example embodiment of the present invention.

This second example embodiment (having or not having n region 350), in place of a planar gate 303, has a trench gate 303', which may be made of polysilicon and is separated from the semiconductor by a corresponding thin gate oxide 309'. Reference numeral 310' designates the corresponding intermediate oxide, that functions as insulation between cathode terminal 301 and trench gate 303'.

The mode of functioning may be analogous to the structures in FIG. 1. However, the structures depicted in FIG. 2 may have a smaller forward voltage drop. In contrast, the structures depicted in FIG. 1 may be easier to manufacture because no trench process is required.

Two further example embodiments of the semiconductor power component according to the present invention may be derived from FIG. 1 and FIG. 2 by selecting $b_{314}$=b and $l_z$<1. These variants, as will be discussed below in connection with FIGS. 5a–e, may have advantages in the manufacturing process.

Figure 4:
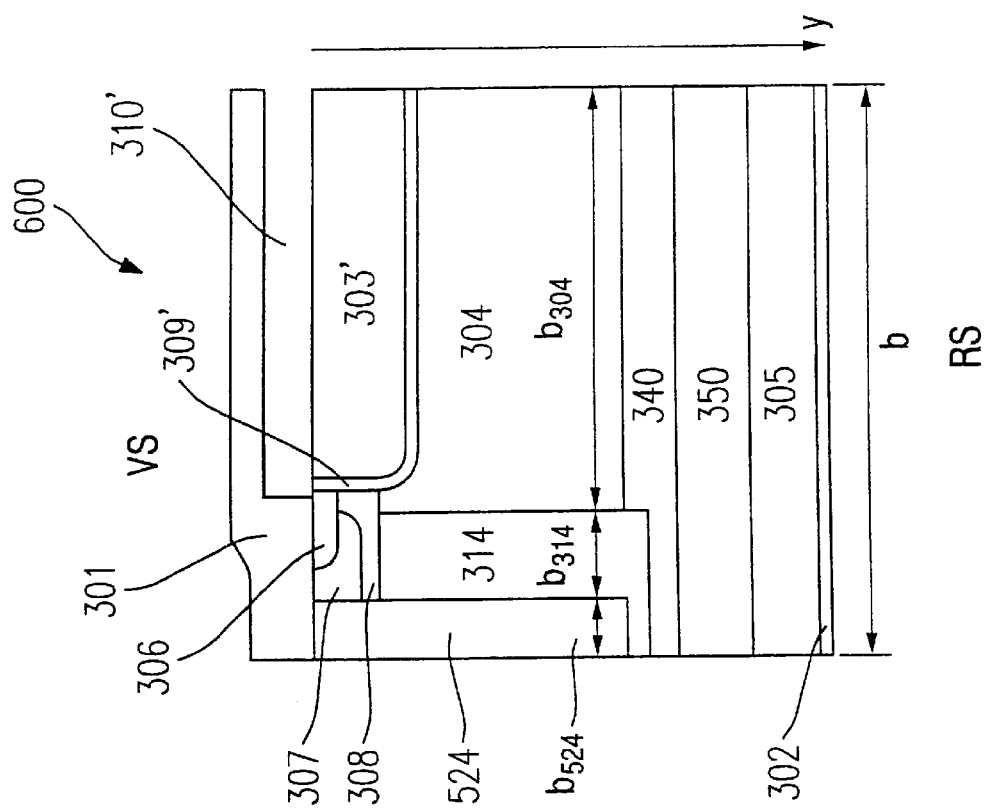
FIG. 4 shows a schematic cross-sectional representation of a semiconductor power component according to a fourth example embodiment of the present invention.
Figure 3:
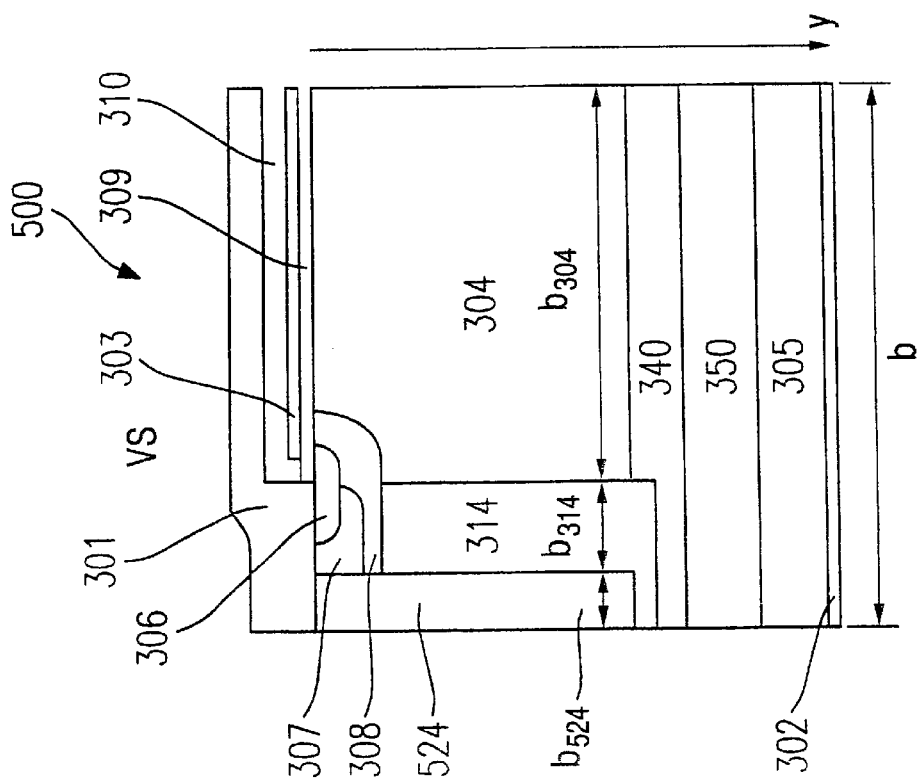
FIG. 3 shows a schematic cross-sectional representation of a semiconductor power component according to a third example embodiment of the present invention.

FIGS. 3 and 4 each shows a schematic cross-sectional representation of a semiconductor power component according to a third and fourth example embodiment of the present invention having a planar trench gate and having an optimal n-region 350, respectively.

In these structures, which may function analogously to FIG. 1 and FIG. 2, p-drift regions 314 are produced using a deep trench, or groove 524, which optionally may be filled by a dielectric or polysilicon. One possible processing sequence for manufacturing is discussed below in connection with FIGS. 6a–e. For the structures depicted in FIGS. 3 and 4, it may be essential that the degree of compensation K(y)>1 be set so that it has a maximum in the area of the end of p-drift region 314 that is away from the first semiconductor surface, and also that a continuous vertical path of region 304 remains from the front-side semiconductor surface to n$^-$-drift region 340, over which the current flow of electrons may be possible.

FIGS. 5a–e shows a representation of essential process steps of an example embodiment of the manufacturing method according to the present invention for the semiconductor power component in accordance with the first and second example embodiments.

The point of departure is, e.g., a p$^+$-substrate 305a having a first n layer 350a, that may be optionally produced on the former, onto which by epitaxy one part of n$^-$-drift region 340a was deposited.

Alternatively, an n-substrate having p$^-$-rear-side diffusion or an n-substrate having a p$^-$-epitaxy layer may be used.

Figure 5A:
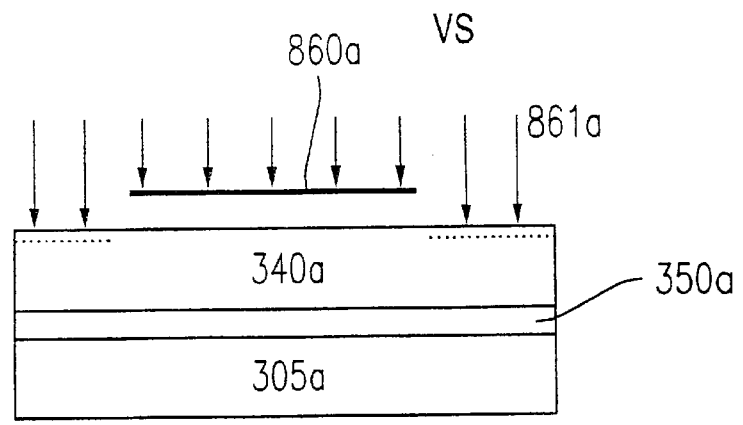
FIGS. 5a–e show a representation of the essential process steps of an example embodiment of a manufacturing method according to the present invention for the semiconductor power component in accordance with the first and second example embodiments.
Figure 5B:
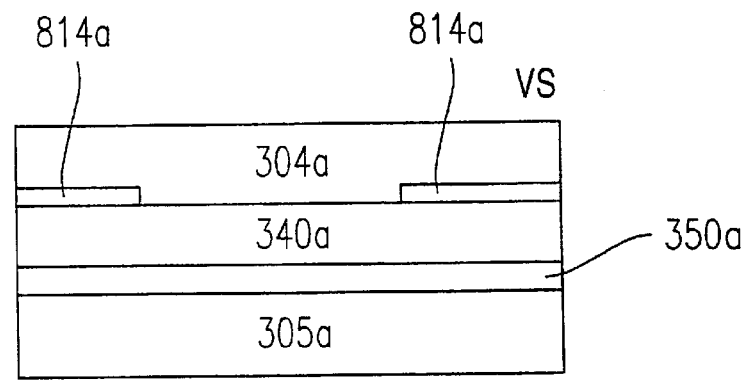
Figure 5C:
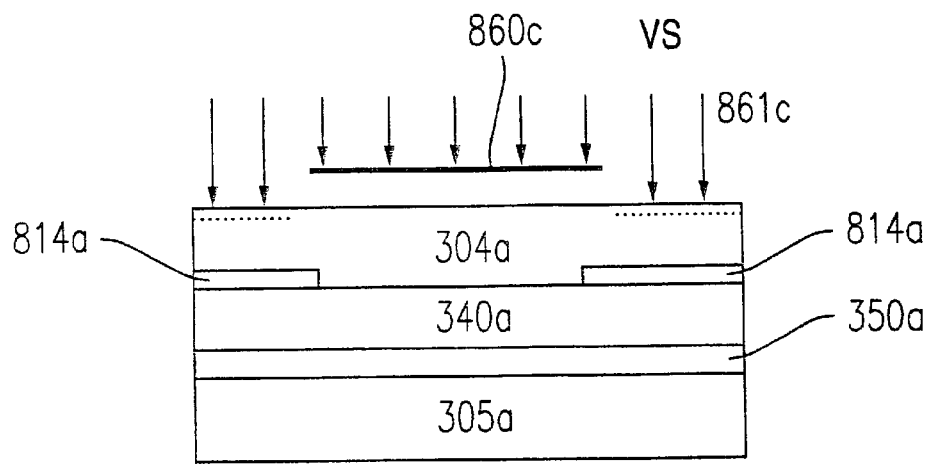
Figure 5D:
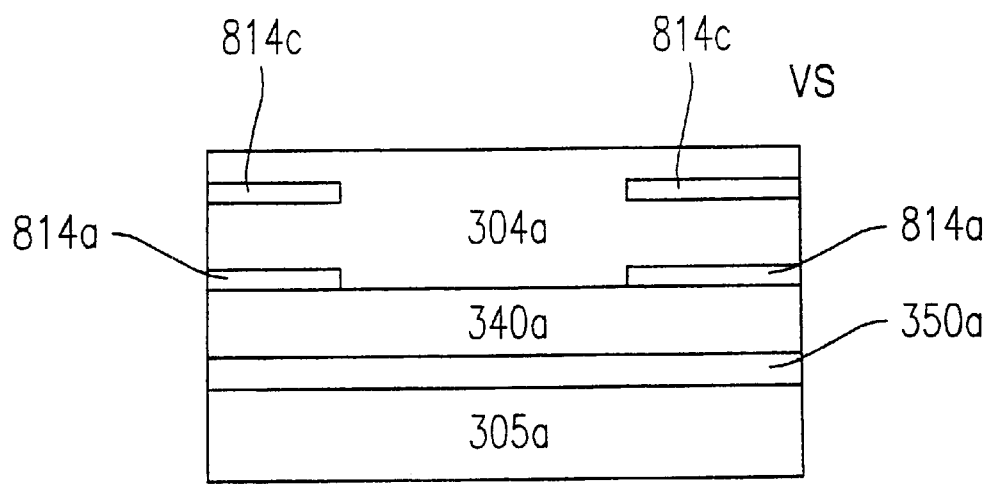

In the following operational process, shown in FIG. 5a, a player 861a is implanted, which is structured using a photomask 860a. Then, as is shown in FIG. 5b, a partial thickness of—drift region 304a grows, previously implanted p regions 814a diffusing out up to a certain point. As is shown in FIG. 5c, there now occurs a renewed p-implantation 861c, structured using photomask 860c, above region 814a to generate p-region 814c. Subsequently, an epitactical growth of a further partial thickness of n-drift region 304a occurs, previously introduced p-regions 814a, 814c once again somewhat diffusing out. This sequence of working steps, implantation followed by epitaxy, is repeated until n-drift region 304a has achieved its target thickness (see FIG. 5d), which may be defined, for example, on the basis of the desired pulse resistance.

In this context, the desired degree of compensation K(y) may be set by a corresponding selection of the implantation doses and/or window widths in the photomask and/or variable doping during the epitaxy.

On the wafer that is pre-processed in this manner, all further structures that may be required to represent the V-IGBT according to the first or the second example embodiment may be generated from the wafer using standard manufacturing methods of semiconductor technology.

In contrast to the method proposed in German Published Patent Application No. 196 04 043, the manufacturing process described here may be less expensive because only the p-dopings are structured using a photomask. The n-doping required for the functioning may be made available directly through epitaxy.

Figure 5E:
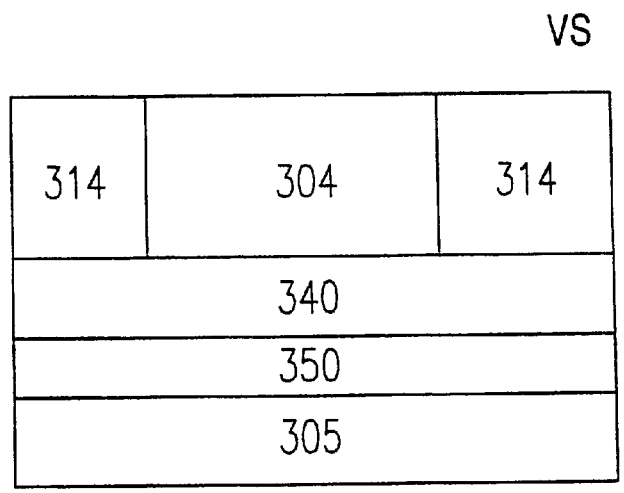

Finally, as is shown in FIG. 5e, there is a drive-in step, in which previously implanted p-regions 814a, 814c diffuse out. In this context, they melt together, as is shown, to form p-drift region 314. From regions 305a, 350a, 340a, and 304a emerge corresponding regions 305, 350, 340, 304, which were discussed above with reference to FIGS. 1 and 2. Finally, the creation of the MOS miniature-circuit-breaker assemblies occur in the familiar manner.

A goal of an effective manufacturing method of this type may be to make do with the fewest possible implantation/epitaxy sequences. However, this aim may be limited by the developmental trend towards ever smaller half-cell widths. In other words, if it were attempted for reasons of homogeneity of the physical processes in the active region of the V-IGBT to assign an identical p-drift region to each half-cell and to generate the former using the fewest possible implantation/epitaxy sequences, then it may be required to choose a high vertical outdiffusion of the implanted p-regions. But this may also mean, in the countermove, due to K(y)>1, a high lateral outdiffusion.

Therefore, under the above marginal conditions, limits are set to a cell reduction. This difficulty may be avoided, in a system having strip-shaped p-body regions 308, by executing p-drift regions 314 also in a strip-shaped fashion and arranging them so as to be not parallel to the former, but rather at an, e.g., right angle.

This may be achieved in FIG. 1 and FIG. 2 by selecting $b_{314}$=b and $l_z$<1. This type of arrangement of MOS miniature-circuit-breaker assemblies and compensation structures (p-drift regions) in relation to each other is not limited to V-IGBTs, but rather it may also be used in other vertical components, such as vertical MOS transistors having compensation structures.

FIGS. 6a–e show a representation of the essential process steps of an example embodiment of the manufacturing method according to the present invention for the semiconductor power component according to the third and fourth example embodiments.

Figure 6A:
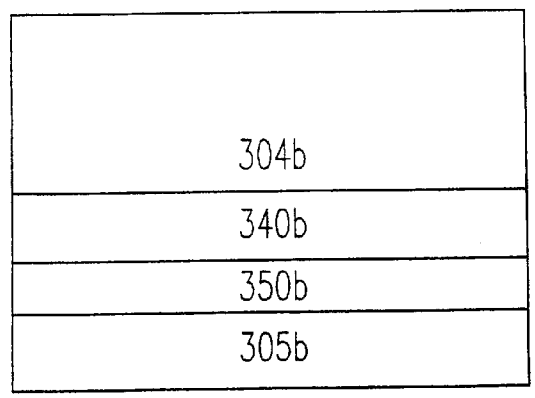
FIGS. 6a–e show a representation of essential process steps of an example embodiment of a manufacturing method according to the present invention for the semiconductor power component in accordance with the third and fourth example embodiments.
Figure 6B:
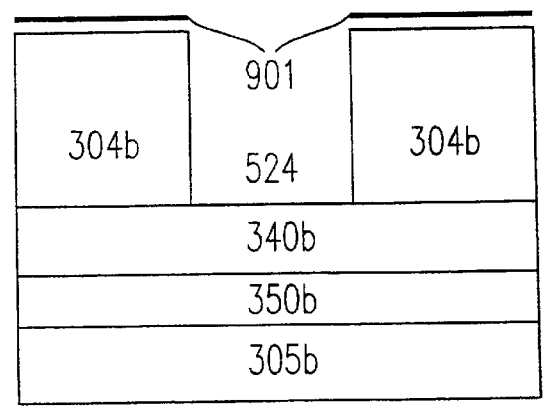
Figure 6C:
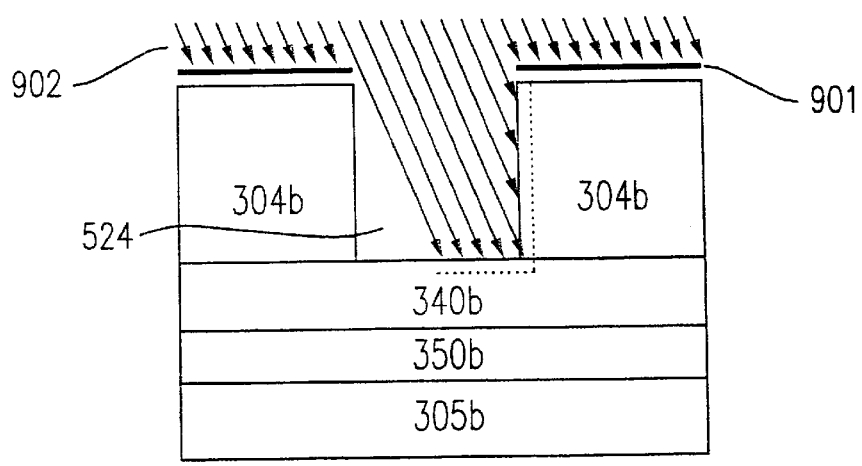
Figure 6D:
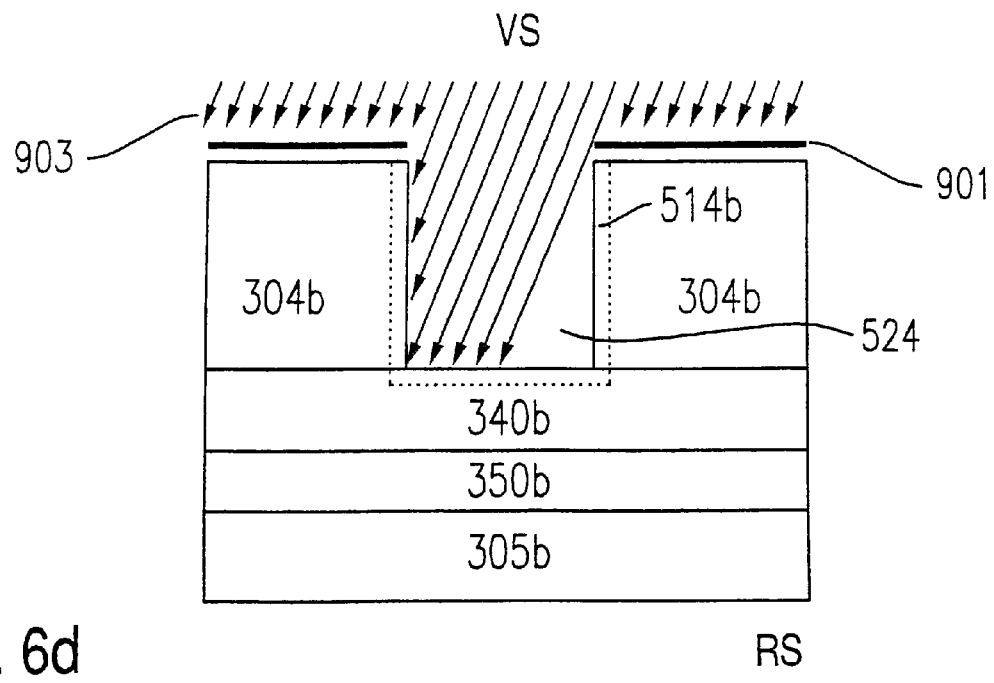
Figure 6E:
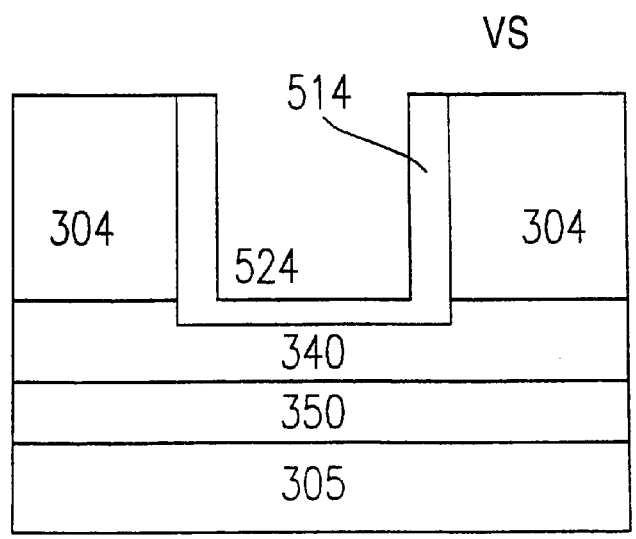
Figure 8:
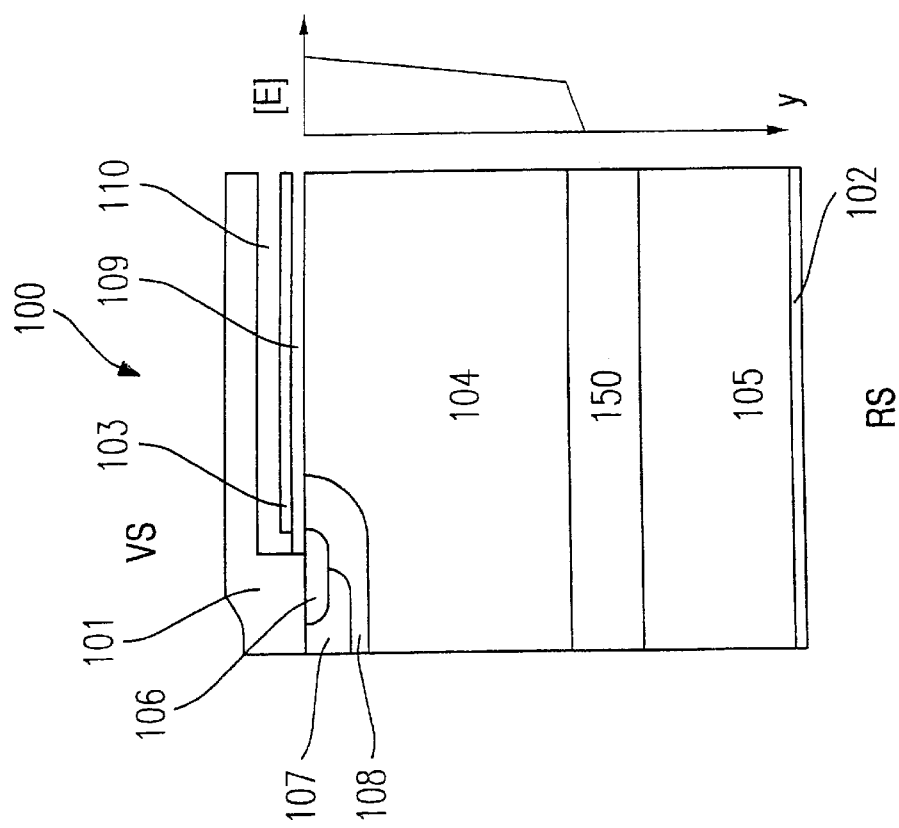
FIG. 8 shows a schematic cross-sectional representation of a conventional PT-IGBT.
Figure 7:
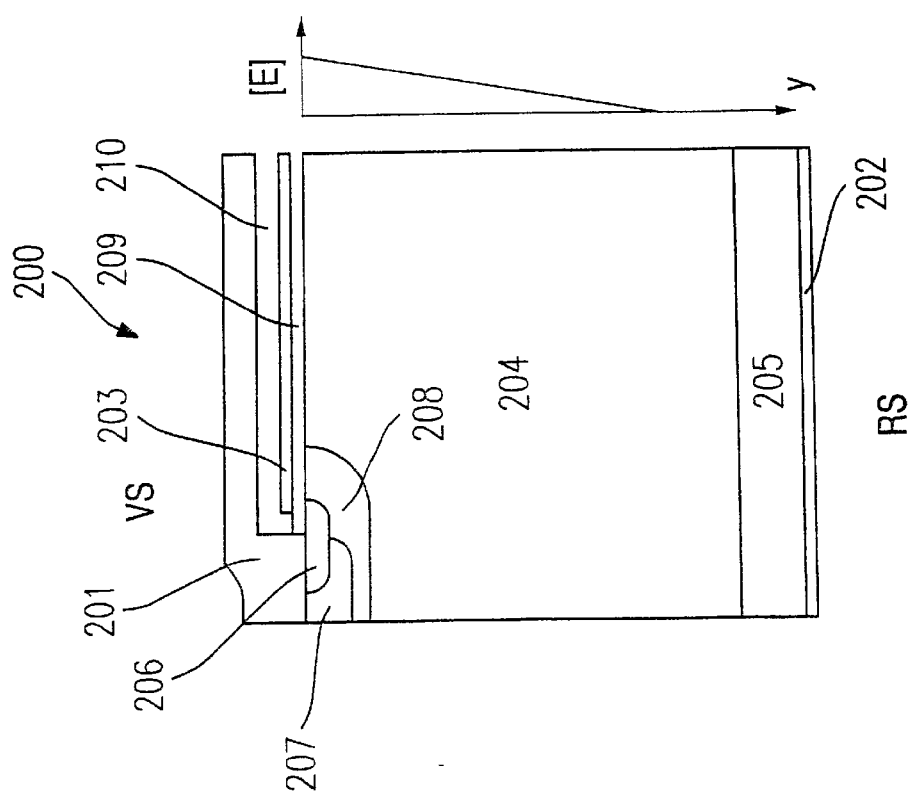
FIG. 7 shows a schematic cross-sectional representation of a conventional NPT-IGBT.

In a wafer according to FIG. 6a having the layer sequence—drift region 304b, n-region 340b, optional n-region 350b, and p$^+$-emitter 305b, trenches 524 are etched, in accordance with FIG. 6b, on the wafer upper side, a mask 901 being used for the structure formation. The latter may have parallel side walls running perpendicular. But they may also have slanted side walls, so that in cross-section they are V-shaped or U-shaped, having a width that increases towards the top.

Using two sequential p-implantations 902, 903 at angles that are equal but opposite with respect to the y direction, p-dopings 514c, 514d may be introduced into the walls and the base of trenches 524, so that K(y)>1. By an appropriate selection of the trench width and implantation angle, it may also be achieved that the degree of compensation has a maximum at the height of the base of trenches 524. Subsequently, after removing mask 901 and filling trenches 524, e.g., with a dielectric, it may be possible by outdiffusion to generate p-regions 514 in accordance with drift region 314. Then, from regions 305b, 350b, 340b, 304b emerge corresponding regions 305, 350, 340, and 304, which were discussed above with reference to FIGS. 3 and 4. Finally, the creation of the MOS miniature-circuit-breaker assemblies may occur in the familiar manner, using standard process steps of semiconductor technology.

To optimize the dynamic characteristics of the component, it may be possible to insert into the process sequence according to FIGS. 5a–e or FIGS. 6a–e process steps that reduce the carrier service life.

Although the present invention has been described above on the basis of a example embodiment, it may not be limited thereto, but rather may be modified in many ways.

If, e.g., the doping types and the signs of the voltage to be applied are reversed, then from the n-channel IGBT a corresponding p-channel IGBT is obtained. In general, the latter is superior to the n-channel NPT-IGBT with respect to latch-up resistance, but it may be inferior with respect to avalanche resistance.

What is claimed is:

1. A semiconductor power component, comprising:

a rear-side anode contact;

a rear-side emitter region of a first conductivity type connected to the rear-side anode contact;

a drift region connected to the rear-side emitter region and partially extending to a front-side surface, the drift region including a first drift region of a second conductivity type, a second drift region of the second conductivity type, and a third drift region of the first conductivity type, the first drift region being a buried region, the second drift region connecting the front-side surface to the first drift region, the third drift region connecting the front-side surface to the first drift region;

a front-side MOS control structure including a source region of the second conductivity type introduced into the drift region and a body region of the first conductivity type introduced into the drift region, and further including a control contact arranged to be insulated above the body region and above a part of the drift region that borders on the body region and extends to the front-side surface; and a front-side cathode contact connected to the source region and the body region, wherein a degree of compensation determinable from the second drift region and the third drift region is greater than one and has a maximum in an area of a side of the third drift region that is facing away from the front surface, the third drift region being arranged to border on the body region.

2. The semiconductor power component according to claim 1, further comprising:

a buffer region of the second conductivity type arranged between the first drift region and the rear-side emitter region.

3. The semiconductor power component according to claim 1, further comprising:

a contact region of the first conductivity type partially surrounding the source region.

4. The semiconductor power component according to claim 1, wherein the control contact is a trench gate.

5. The semiconductor power component according to claim 1, wherein the body region, the source region, and the third drift region run in a strip-shaped manner and are not parallel to each other.

6. The semiconductor power component according to claim 1, further comprising:

a trench surrounded by the third drift region; and an insulating material to fill the trench.

7. The semiconductor power component according to claim 1, wherein the first conductivity type is n-type and the second conductivity type is p-type.

* * * * *